United States Patent [19]
Spencer et al.

[11] Patent Number: 5,665,165
[45] Date of Patent: Sep. 9, 1997

[54] SEAL AND A CHAMBER HAVING A SEAL

[75] Inventors: John A. Spencer, Derby; David S. Rickerby, Derbyshire, both of England

[73] Assignee: Rolls-Royce plc, London, England

[21] Appl. No.: 733,638

[22] Filed: Oct. 17, 1996

[30] Foreign Application Priority Data

Oct. 27, 1995 [GB] United Kingdom ............. 9522062

[51] Int. Cl.[6] ............................................. C23C 16/00
[52] U.S. Cl. ............................................. 118/718
[58] Field of Search ............................................. 118/718

[56] References Cited

U.S. PATENT DOCUMENTS

| | | | |
|---|---|---|---|
| 3,667,626 | 6/1972 | Torelli et al. | 214/17 |
| 4,480,585 | 11/1984 | Gattuso | 118/719 |
| 4,494,478 | 1/1985 | Lacour et al. | 118/719 |
| 4,587,135 | 5/1986 | Diener et al. | 427/13 |
| 4,787,227 | 11/1988 | Lievens et al. | 72/38 |
| 4,811,583 | 3/1989 | Lievens et al. | 72/38 |

FOREIGN PATENT DOCUMENTS

| | | |
|---|---|---|
| 1512837 | 6/1978 | United Kingdom. |
| 2243844 | 11/1991 | United Kingdom. |

*Primary Examiner*—Richard Bueker
*Attorney, Agent, or Firm*—Cushman Darby & Cushman IP Group Of Pillsbury Madison & Sutro LLP

[57] ABSTRACT

A vacuum chamber is provided with a pair of seals to enable a fibre to be continuously supplied into and removed from the vacuum chamber for application of a coating. The seals comprise a first chamber which is supplied with argon and a second chamber which is evacuated by a pump. The first chamber is connected to atmosphere by a first hypodermic tube, the first chamber is connected to the second chamber by a second hypodermic tube and the second chamber is connected to the interior of the vacuum chamber by a third hypodermic tube. The hypodermic tubes are coaxial and are telescoped together. The fibre is arranged to pass sequentially through the hypodermic tubes into the vacuum chamber. The argon supplied to the first chamber reduces the air flow down the hypodermic tubes. The seal maintains the pressure in the vacuum chamber and does not contaminate the fibre.

31 Claims, 2 Drawing Sheets

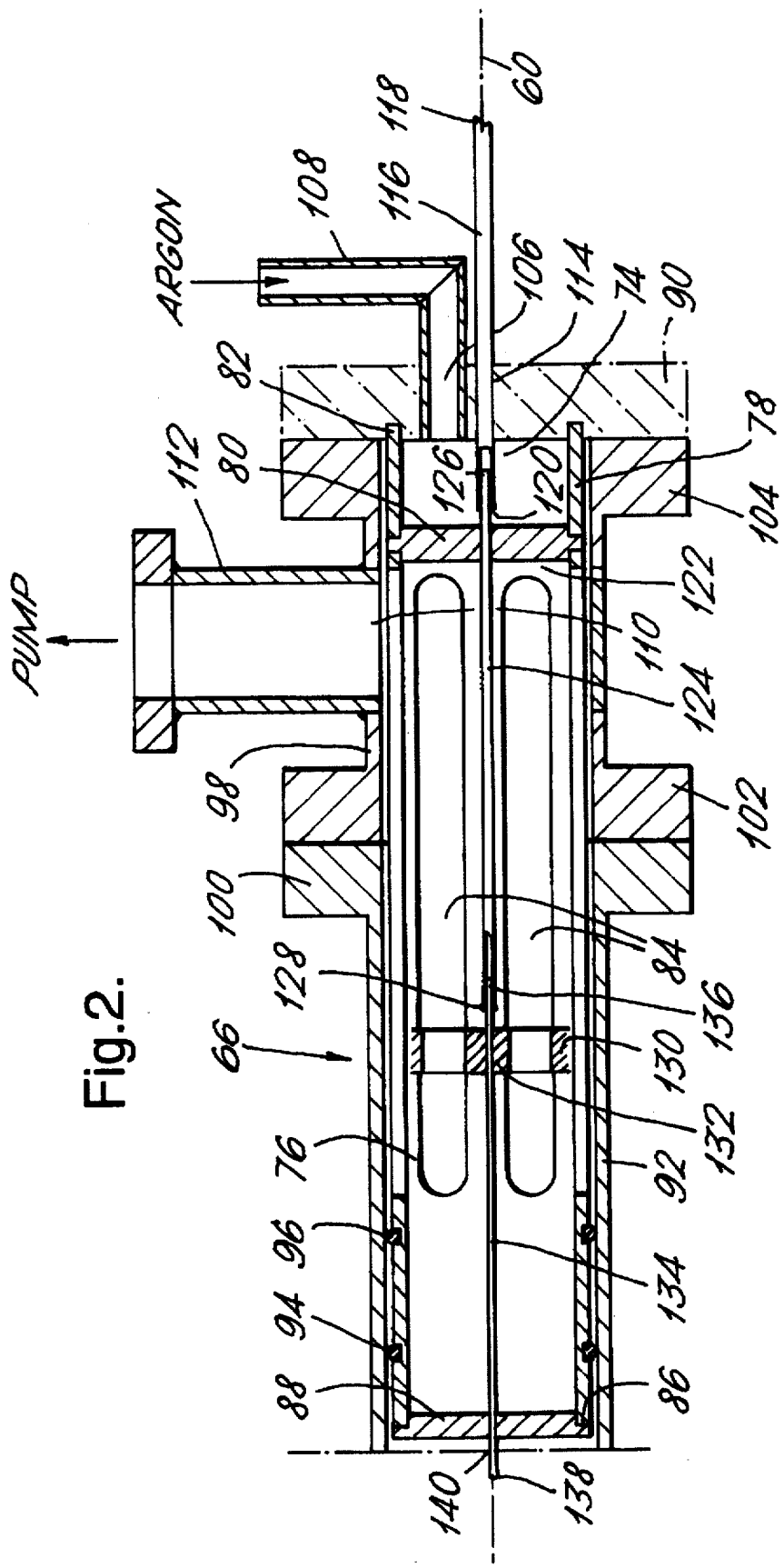

SEAL AND A CHAMBER HAVING A SEAL

The present invention relates to a seal and in particular to a seal for a chamber to enable a continuous length of fibre to be supplied into or removed from the chamber. The invention is most particularly applicable to seals for chambers within which a coating is deposited onto a continuously moving fibre by vapour deposition.

It is known in the prior art to deposit a coating onto a fibre for use in the manufacture of a metal matrix composite material, by drawing a fibre continuously through a chamber in which deposition of the coating material takes place by vapour deposition.

It is known from GB2243844A to deposit a coating onto a fibre by drawing a fibre continuously through a vacuum chamber in which the coating material is deposited by sputter ion plating, by passing the fibre through a plasma discharge contained within a hollow cylindrical cathode electrode. This document discloses that the fibre passes through liquid mercury gas seals in the walls of the vacuum chamber.

Unfortunately the mercury gas seals do not provide a satisfactory seal to maintain the interior of the vacuum chamber at vacuum pressures and also the fibre passing through the mercury gas seals becomes contaminated with mercury and or the interior of the vacuum chamber becomes contaminated with mercury. It is important to maintain the pressure in the vacuum chamber within a preselected pressure range in order for satisfactory operation of the sputter ion plating. It is also important to ensure that the fibre, or the vacuum chamber, is not contaminated because the fibre is to be used in the manufacture of a metal matrix composite material, and contaminants on the fibre may effect the properties of the resulting metal matrix composite material.

The present invention seeks to provide a seal which will maintain a chamber at a predetermined pressure range, while allowing a fibre to be continuously passed through the seal without contamination of the fibre and, or the vacuum chamber.

Accordingly the present invention provides a chamber having means for creating and maintaining a predetermined pressure in the interior of the chamber, at least one seal to allow a fibre to be passed continuously through the seal into, or out of, the chamber, the seal comprising a first chamber, a second chamber, means to supply inert gas to the first chamber, means for extracting gas from the second chamber, a relatively small diameter first tube connecting the first chamber to the interior, or exterior, of the chamber, a relatively small diameter second tube connecting the first chamber and the second chamber, a relatively small diameter third tube connecting the second chamber and the exterior, or interior, of the chamber, the first, second and third tubes are aligned to allow the fibre to pass through the tubes from the interior of the chamber to the exterior of the chamber.

Preferably the first, second and third tubes are arranged coaxially.

Preferably the first tube has a larger diameter than the second tube and the second tube has a larger diameter than the third tube.

Preferably one end of the second tube is arranged in an end of the first tube and one end of the third tube is arranged in the other end of the second tube.

Preferably the supply of inert gas is a supply of argon.

Preferably the inner diameter of the tubes is in the range of 0.2 mm to 2.0 mm. The inner diameter of the first tube may be approximately 1.8 mm. The inner diameter of the second tube may be approximately 1.1 mm. The inner diameter of the third tube may be approximately 0.2 mm.

Preferably the length of the tubes is in the range of 100 mm to 150 mm.

Preferably the tubes have a large length to diameter ratio to provide a low conductance flow path for gases.

Preferably the chamber is a vacuum chamber, the means for creating and maintaining a predetermined pressure in the interior of the vacuum chamber is a vacuum pump, means for admitting a plasma forming gas into the vacuum chamber, a cylindrical hollow electrode is positioned within the vacuum chamber to act as a cathode electrode, the inner surface of the cylindrical hollow electrode is made of a material to be deposited upon the fibre, means for passing the fibre continuously through the cylindrical hollow electrode, means for forming a plasma discharge within the cylindrical hollow electrode to cause material to be sputtered from the cylindrical hollow electrode onto the fibre, means for applying an electrical potential to the fibre.

Preferably the vacuum chamber includes means for cooling the cylindrical hollow electrode. The means for cooling the cylindrical hollow electrode may comprise a hollow annular tank containing water.

Preferably the vacuum chamber includes a magnetic coil arranged around the cylindrical hollow electrode to reduce the electron heating of the fibre.

Preferably the vacuum chamber includes means for cooling the magnetic coil. The means for cooling the magnetic coil may comprise a second hollow tank containing water.

Preferably the length to diameter ratio of the cylindrical hollow electrode is at least 3 to 1.

Preferably the relatively small diameter first tube connects the first chamber to the exterior of the vacuum chamber, the relatively small diameter third tube connects the second chamber and the interior of the vacuum chamber.

The present invention also provides a seal to allow a fibre to be passed continuously through the seal, the seal comprising a first chamber, a second chamber, an inlet port for removably connecting the first chamber to a supply of inert gas, an outlet port for removably connecting the second chamber to an extraction pump, a relatively small diameter first tube connecting the first chamber to the exterior at a first end of the seal, a relatively small diameter second tube connecting the first chamber and the second chamber, a relatively small diameter third tube connecting the second chamber to the exterior at a second end of the seal, the first, second and third tubes are aligned to allow the fibre to pass through the tubes from the first end of the seal to second end of the seal.

Preferably the first, second and third tubes are arranged coaxially.

Preferably the first tube has a larger diameter than the second tube and the second tube has a larger diameter than the third tube.

Preferably one end of the second tube is arranged in an end of the first tube and one end of the third tube is arranged in the other end of the second tube.

Preferably the first chamber is removably connected to a supply of argon.

Preferably the inner diameter of the tubes is in the range of 0.2 mm to 2.0 mm. The inner diameter of the first tube may be approximately 1.8 mm. The inner diameter of the second tube may be approximately 1.1 mm. The inner diameter of the third tube may be approximately 0.2 mm.

Preferably the length of the tubes is in the range of 100 mm to 150 mm.

Preferably the tubes have a large length to diameter ratio to provide a low conductance flow path for gases. The length to inner diameter ratio may be 50 to 750.

The present invention will be more fully described by way of example with reference to the accompanying drawings, in which:

FIG. 2 is an enlarged cross-sectional view through one of the seals shown in FIG. 1.

Figure 1:
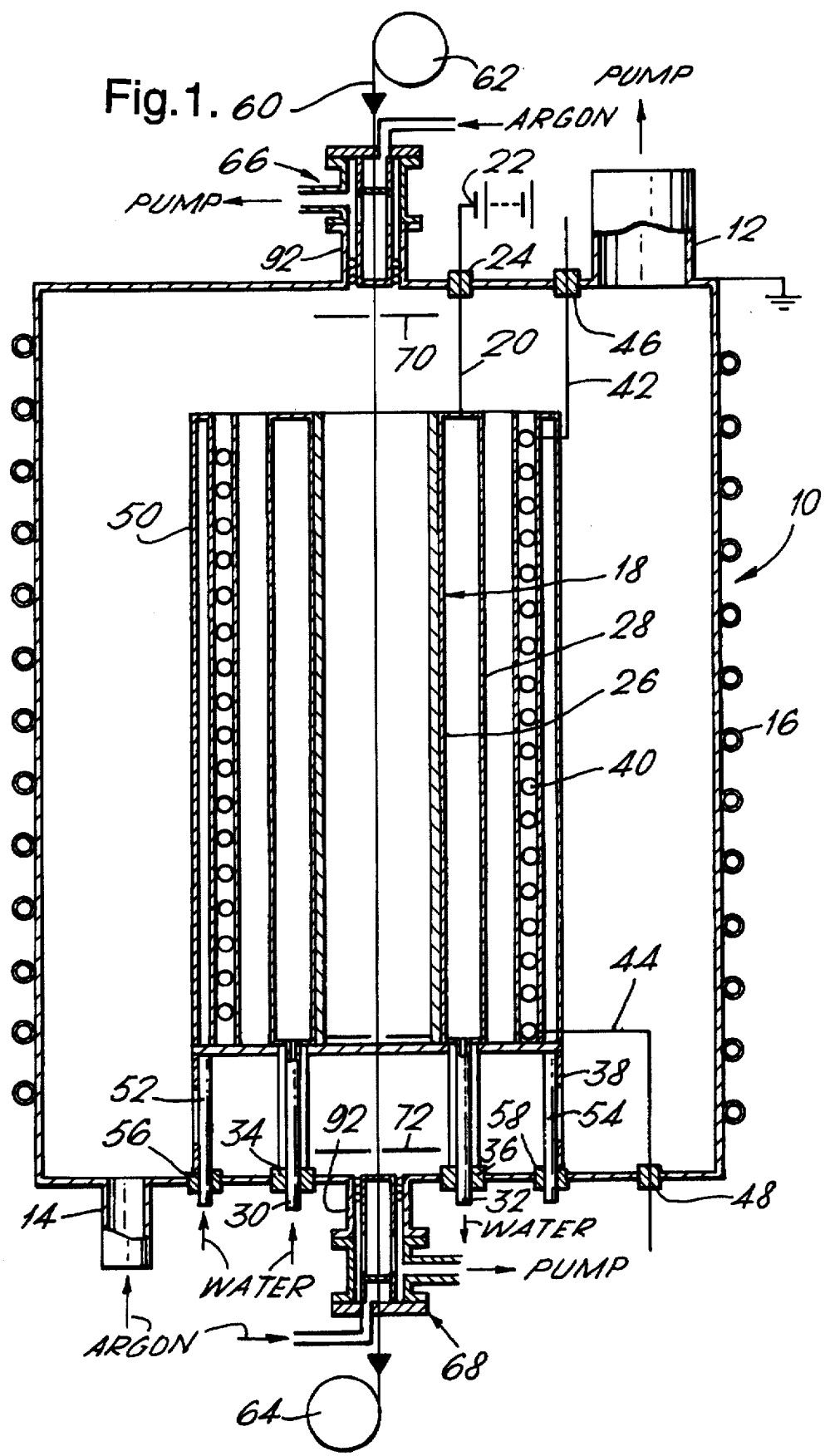
FIG. 1 is a cross-sectional view through a vacuum chamber for coating fibres having two seals according to the present invention.

An apparatus for coating a silicon carbide fibre by means of sputter ion plating is show in FIG. 1. The apparatus comprises a vacuum chamber 10 which is evacuated by means of a vacuum pump (not shown) via an outlet port 12. The vacuum chamber 10 is supplied with a plasma forming gas, e.g. argon, from a suitable supply (not shown) via an inlet port 14. A coiled pipe 16 is provided around the vacuum chamber 10, and the coiled pipe 16 is supplied with water to cool the vacuum chamber 10. A cylindrical electrode 18 is provided within the vacuum chamber 10 and the electrode 18 is electrically connected, via a wire 20, to a negative terminal of an electrical power supply 22. The wire 20 passes through the wall of the vacuum chamber 10 and is electrically insulated from the wall by an insulator 24. Thus the cylindrical electrode 18 forms a hollow cathode in operation when a negative potential is supplied to it from the power supply 22.

The cylindrical electrode 18 comprises an inner wall 26 which is manufactured from the material to be deposited upon the fibre. The cylindrical electrode 18 also comprises a hollow annular tank 28 which surrounds and is in intimate thermal contact with the inner wall 26. The hollow tank 28 is provided with an inlet pipe 30 and outlet pipe 32 and the hollow tank 28 is supplied with water, from a supply of water (not shown) via inlet pipe 30, to cool the cylindrical electrode 18. The used water is discharged from the hollow tank 28 via outlet pipe 32. The hollow tank 28 allows water to be circulated against the inner wall 26 of the cylindrical electrode 18 thereby cooling the cylindrical electrode 18. The inlet and outlet pipes 30 and 32 pass through the wall of the vacuum chamber via insulated lead throughs 34 and 36 respectively. The cylindrical electrode 18 is mounted from the vacuum chamber 10 by a support 38 which insulates the cylindrical electrode 18 from the vacuum chamber 10. The vacuum chamber 10 is earthed.

A magnetic coil 40 is positioned coaxially around the cylindrical electrode 18 and is spaced radially from the hollow tank 28. The magnetic coil 40 is electrically connected via electrical cables 42 and 44 to an electrical power supply (not shown). The cables 42 and 44 pass through the wall of the vacuum chamber 10 via insulated lead throughs 46 and 48 respectively. The magnetic coil 40 is surrounded by a second hollow annular tank 50 which surrounds and is in intimate thermal contact with the magnetic coil 40. The second hollow tank 50 is provided with an inlet pipe 52 and outlet pipe 54 and the second hollow tank 50 is supplied with water, from a supply of water (not shown) via inlet pipe 52, to cool the magnetic coil 40. The used water is discharged from the second hollow tank 50 via outlet pipe 54. The second hollow tank 50 allows water to be circulated around the magnetic coil 40. The inlet and outlet pipes 52 and 54 pass through the wall of the vacuum chamber via insulated lead throughs 56 and 58 respectively.

A fibre 60 upon which a coating is to be deposited is supplied from a reel 62 into the vacuum chamber 10 and the coated fibre 60 is collected upon a reel 64. The fibre 60 is supplied into the vacuum chamber 10 via a first seal 66 and the coated fibre 60 exits the vacuum chamber 10 via a second seal 68. The first and second seals 66 and 68 are identical in operation, but the inner diameters of the tubes of the seal 68 are larger to allow the coated fibre 60 to exit the vacuum chamber 10.

A pair of shields 70 and 72 are provided in the vacuum chamber 10 in the proximity of the seals 66 and 68 to allow the fibre 60 to pass therethrough, but which prevent coating material depositing upon the seals 66 and 68.

The inner wall 26 of the cylindrical electrode 18 may be made in the form of separate plates of different materials which can be energised independently to enable the composition of the coating to be varied. For example the inner wall may be made of alternate plates of titanium and carbon so that a coating of varying non-stoichiometry may be deposited upon a fibre 60 of silicon carbide.

Alternatively there may be more than one cylindrical electrode 18 positioned coaxially but spaced apart axially so that the fibre 60 passes sequentially through the cylindrical electrodes 18 to produce a multi-layer coating on the fibre 60.

In operation the vacuum chamber 10 is evacuated to a pressure of about $1\times10^{-3}$ Torr and is heated to assist in the out-gassing of the interior of the vacuum chamber 10. When the required pressure is reached with in the vacuum chamber 10 an inert gas for example argon is supplied into the vacuum chamber 10 though the port 14. The inert gas enables a glow discharge, or plasma, to be set up within the cylindrical electrode 18. Suitable pressures are in the range of $1\times10^{-1}$ to $2.5\times10^{-2}$ Tort and suitable cylindrical electrode potentials are in the range of 300 to 900 volts.

For the optimum deposition rate of the coating material on the fibre 60 the cylindrical electrode length and diameter must be optimised. We have found the optimum diameter is 35 mm and the optimum length is between 100 mm and 350 mm. The length to diameter ratio must be greater than 3 to 1.

The use of the water cooled hollow tank 28 enables the cylindrical electrode 18 to be cooled increasing the deposition rate on the fibre 60. The magnetic coil 40 produces a magnetic field within the vacuum chamber 10, the magnetic field reduces the number of electrons reaching the fibre 60 and hence reduces the temperature of the fibre 60 as it passes through the cylindrical electrode 18, this also enables the deposition rate to be increased. The magnetic field produced by the magnetic coil 40 also increases the ionisation efficiency within the cylindrical electrode 18. The use of the water cooled second hollow tank 50 enables the magnetic coil 40 to be cooled increasing the deposition rate on the fibre 50. The combined effect of all these features enables deposition rates of $250\times10^{-6}$ m to $500\times10^{-6}$ m per hour.

The seals 66 and 68 enable the fibre 60 to pass continuously into, and out of, the vacuum chamber 10 while maintaining the required operating pressure within the vacuum chamber 10 and also the seals 66 and 68 do not contaminate the fibre 60. The fibres are approximately $100\times10^{-6}$m to $250\times10^{-6}$ m in diameter.

One of the seals 66 is shown more clearly in FIG. 2. The seal 66 comprises a first chamber 74 and a second chamber 76. The first and second chambers 74 and 76 are defined partially by a hollow cylindrical member 78. A disc shaped member 80 is spaced from the first end 82 of the hollow cylindrical member 78 to separate the first and second chambers 74 and 76 respectively. The hollow cylindrical member 78 is provided with several apertures 84 to interconnect with the second chamber 76 in the interior of the hollow cylindrical member 78. In this example the apertures are axially extending slots. The second end 86 of the hollow cylindrical member 78 is closed by a disc shaped member 88. The first is closed the hollow cylindrical member is closed by a larger diameter disc shaped member 90. Thus the first chamber is defined by the hollow cylindrical member 78, the disc 80 and the disc 90.

The hollow cylindrical member 78 is positioned coaxially within an outlet port 92 on the vacuum chamber 10. The second end of the hollow cylindrical member 78 is provided with two axially spaced O-ring seals 94 and 96 on its outer surface which cooperate with the inner surface of the outlet port 92. The hollow cylindrical member 78 is also positioned. coaxially within an extension tube 98, which is bolted to the outlet port 92 by means of flanges 100 and 102 on the outlet port 92 and a first end of the extension tube 98 respectively. The second end of the extension tube 98 is bolted to the disc shaped member 90 by means of a flange 104 on the extension tube 78. Thus the second chamber 76 is defined by the hollow cylindrical member 78, the disc shaped member 88 and the disc shaped member 80.

The disc shaped member 90 has an aperture 106 to which is connected a pipe 108. The pipe 108 is connected to a supply of inert gas, for example argon, to enable the first chamber 74 to be supplied with inert gas. The extension tube 98 has an aperture 110 to which is connected a pipe 112. The pipe 112 is connected to a vacuum pump to enable the second chamber 76 to be evacuated. The apertures 84 provide a flow passage from the second chamber 76 to the pipe 112.

The disc shaped member 90 has a small diameter aperture 114, approximately 1.8 mm, on its axis through which a first small diameter hypodermic tube 116 passes. The first tube 116 forms a sealing fit with the aperture 114 of the disc 90. The first end 118 of the first tube 116 is outside the seal 66, and the second end 120 of the first tube 116 is within the first chamber 74. The first tube has a length of approximately 100 mm. The disc shaped member 80 has a small diameter aperture 122, approximately 1.1 mm, on its axis through which a second small diameter hypodermic tube 124 passes. The second tube 124 forms a sealing fit with the aperture 122 of the disc 80. The first end 126 of the second tube 124 is within the chamber 74, and the first and second tubes 116 and 124 are coaxial and the first end 126 of the second tube 124 is within the second end 120 of the first tube 116. The second end 128 of the second tube 124 is within the second chamber 76. The second tube has a length of approximately 100 mm. A disc shaped member 130 is provided in the second chamber 76 and it has a small diameter aperture 132 on its axis through which a third small diameter hypodermic tube 134 passes. The third tube has a diameter of approximately 0.5 mm.

The first end 136 of the second tube 124 is within the second chamber 76, and the second and third tubes 124 and 134 are coaxial and the first end 136 of the third tube 134 is within the second end 128 of the second tube 124. The third tube 134 passes through a small diameter aperture 140 on the axis of the disc shaped member 88. The third tube 134 forms a sealing fit with the aperture 140. The second end 138 of the third tube 134 is within the Vacuum chamber 10. The third tube has a length of approximately 150 mm.

In operation a fibre is passed through the aligned hypodermic tubes 116, 124 and 134 of the seal 66. Inert gas, e.g. argon, is supplied through pipe 108 to the first chamber 74 to pressurise the first chamber 74 to a pressure of approximately 15 pounds per square inch. $1.013 \times 10^5$ Pa. The second chamber 76 is evacuated by means of the pump via the pipe 112 to a pressure of approximately $1 \times 10^{-1}$ Torr. The pressure in the vacuum chamber 10 is approximately $1 \times 10^{-2}$ Torr. The first tube 116 provides a low conductance flow path between the first chamber 74 and atmospheric pressure. The pressurised inert gas in the first chamber 74 flows from the first chamber 74 into the second end 120 of the first tube 116. A first portion of the inert gas flows through the first tube 116 to atmosphere and prevents, or reduces the amount of, air or more particularly the oxygen in the air from flowing through the first tube 116 into the first chamber 74. A second portion of the inert gas flowing into the first tube 116 flows through the second tube 124. The second tube 124 provides a low conductance flow path between the first chamber 74 and the second chamber 76. A portion of the inert gas flowing through the second tube 124 flows from the second end 128 into the second chamber 76 and prevents, or reduces the amount of, air flowing into the second chamber 76. The other portion of the inert gas flowing through the second tube 124 flows through the third tube 134 into the vacuum chamber 10 and prevents, or reduces the amount of, air flowing into the vacuum chamber 10. The third tube 134 provides a low conductance flow path between the second chamber 76 and the vacuum chamber 10. The inert gas, and any air, flowing into the second chamber 76 is pumped out of the second chamber 76 through the pipe 112. The inert gas, and any air, flowing into the vacuum chamber 10 is pumped out of the vacuum chamber 10 through the pipe 12.

It is the combination of the first chamber being supplied with inert gas, the second chamber being evacuated and the three concentric small diameter tubes which produces the sealing effect. The seal enables the pressure in the vacuum chamber to be maintained at vacuum pressures, and allows a fibre to be introduced into, or removed from, the vacuum chamber without contamination of the fibre or vacuum chamber.

The seal is also applicable for use with other types of chambers which have a difference in pressure between their interiors and exteriors. But it may be necessary to have the first chamber connected to interior of the chamber by the first tube and the second chamber connected to the exterior of the chamber by the third tube.

We claim:

1. A chamber having means for creating and maintaining a predetermined pressure in the interior of the chamber, at least one seal to allow a fibre to be passed continuously through the seal into, or out of, the chamber, the seal comprising a first chamber, a second chamber, means to supply inert gas to the first chamber, means for extracting gas from the second chamber, a relatively small diameter first tube connecting the first chamber to one of the interior and exterior of the chamber, a relatively small diameter second tube connecting the first chamber and the second chamber, a relatively small diameter third tube connecting the second chamber to one of the exterior and interior of the chamber, the first, second and third tubes are aligned to allow the fibre to pass through the tubes from the interior of the chamber to the exterior of the chamber.

2. A chamber as claimed in claim 1 wherein the first, second and third tubes are arranged coaxially.

3. A chamber as claimed in claim 2 wherein the first tube has a larger diameter than the second tube and the second tube has a larger diameter than the third tube.

4. A chamber as claimed in claim 3 wherein one end of the second tube is arranged in an end of the first tube and one end of the third tube is arranged in the other end of the second tube.

5. A chamber as claimed in claim 1 wherein the supply of inert gas is a supply of argon.

6. A chamber as claimed in claim 1 wherein the inner diameter of the tubes is in the range of 0.2 mm to 2.0 mm.

7. A chamber as claimed in claim 6 wherein the inner diameter of the first tube is approximately 1.8 mm.

8. A chamber as claimed in claim 6 wherein the inner diameter of the second tube is approximately 1.1 mm.

9. A chamber as claimed in claim 6 wherein the inner diameter of the third tube is approximately 0.2 mm.

10. A chamber as claimed in claim 1 wherein the length of the tubes is in the range of 100 mm to 150 mm.

11. A chamber as claimed in claim 1 wherein the tubes have a large length to diameter ratio to provide a low conductance flow path for gases.

12. A chamber as claimed in claim 1 wherein the chamber is a vacuum chamber, the means for creating and maintaining a predetermined pressure in the interior of the vacuum chamber is a vacuum pump, means for admitting a plasma forming gas into the vacuum chamber, a cylindrical hollow electrode is positioned within the vacuum chamber to act as a cathode electrode, the cylindrical hollow electrode has an inner surface, the inner surface of the cylindrical hollow electrode is made of a material to be deposited upon the fibre, means for passing the fibre continuously through the cylindrical hollow electrode, means for forming a plasma discharge within the cylindrical hollow electrode to cause material to be sputtered from the cylindrical hollow electrode onto the fibre, means for applying an electrical potential to the fibre.

13. A vacuum chamber as claimed in claim 12 including means for cooling the cylindrical hollow electrode.

14. A vacuum chamber as claimed in claim 13 wherein the means for cooling the cylindrical hollow electrode comprises a hollow annular tank containing water.

15. A vacuum chamber as claimed in claim 12 including a magnetic coil arranged around the cylindrical hollow electrode to reduce the electron heating of the fibre.

16. A vacuum chamber as claimed in claim 15 including means for cooling the magnetic coil.

17. A vacuum chamber as claimed in claim 16 wherein the means for cooling the magnetic coil comprises a second hollow tank containing water.

18. A vacuum chamber as claimed in claim 12 wherein the length to diameter ratio of the cylindrical hollow electrode is at least 3 to 1.

19. A vacuum chamber as claimed in claim 12 wherein the relatively small diameter first tube connects the first chamber to the exterior of the vacuum chamber, the relatively small diameter third tube connects the second chamber and the interior of the vacuum chamber.

20. A seal to allow a fibre to be passed continuously through the seal, the seal comprising a first chamber, a second chamber, an inlet port for removably connecting the first chamber to a supply of inert gas, an outlet port for removably connecting the second chamber to an extraction pump, a relatively small diameter first tube connecting the first chamber to the exterior at a first end of the seal, a relatively small diameter second tube connecting the first chamber and the second chamber, a relatively small diameter third tube connecting the second chamber to the exterior at a second end of the seal, the first, second and third tubes are aligned to allow the fibre to pass through the tubes from the first end of the seal to second end of the seal.

21. A seal as claimed in claim 20 wherein the first, second and third tubes are arranged coaxially.

22. A seal as claimed in claim 21 wherein the first tube has a larger diameter than the second tube and the second tube has a larger diameter than the third tube.

23. A seal as claimed in claim 22 wherein one end of the second tube is arranged in an end of the first tube and one end of the third tube is arranged in the other end of the second tube.

24. A seal as claimed in claim 20 wherein the first chamber is removably connected to a supply of argon.

25. A seal as claimed in claim 20 wherein the diameter of the tubes is in the range of 0.2 mm to 2.0 mm.

26. A seal as claimed in claim 25 wherein the inner diameter of the first tube is approximately 1.8 mm.

27. A seal as claimed in claim 25 wherein the inner diameter of the second tube is approximately 1.1 mm.

28. A seal as claimed in claim 25 wherein the inner diameter of the third tube is approximately 0.2 mm.

29. A seal as claimed in claim 20 wherein the length of the tubes is in the range of 100 mm to 150 mm.

30. A seal as claimed in claim 20 wherein the tubes have a large length to diameter ratio to provide a low conductance flow path for gases.

31. A seal as claimed in claim 30 wherein the length to inner diameter ratio is 50 to 750.

* * * * *